(12) United States Patent
Tang

(10) Patent No.: US 12,446,150 B2
(45) Date of Patent: Oct. 14, 2025

(54) PREPREG AND USES OF THE SAME

(71) Applicant: TAIWAN UNION TECHNOLOGY CORPORATION, Zhubei (TW)

(72) Inventor: Jui-Hsiang Tang, Zhubei (TW)

(73) Assignee: TAIWAN UNION TECHNOLOGY CORPORATION, Zhubei (TW)

( * ) Notice: Subject to any disclaimer, the term of this patent is extended or adjusted under 35 U.S.C. 154(b) by 9 days.

(21) Appl. No.: 18/613,501

(22) Filed: Mar. 22, 2024

(65) Prior Publication Data
US 2025/0176100 A1     May 29, 2025

(30) Foreign Application Priority Data
Nov. 24, 2023 (TW) ................. 112145577

(51) Int. Cl.
*B32B 27/20* (2006.01)
*H05K 1/03* (2006.01)

(52) U.S. Cl.
CPC ....... *H05K 1/036* (2013.01); *H05K 2201/015* (2013.01); *H05K 2201/0209* (2013.01)

(58) Field of Classification Search
CPC ................................. B32B 2457/08
See application file for complete search history.

(56) References Cited

U.S. PATENT DOCUMENTS

| | | |
|---|---|---|
| 3,391,099 A | 7/1968 | Punderson |
| 5,218,030 A | 6/1993 | Katayose et al. |
| 5,352,745 A | 10/1994 | Katayose et al. |
| 6,352,782 B2 | 3/2002 | Yeager et al. |
| 6,995,195 B2 | 2/2006 | Ishii et al. |
| 2016/0280913 A1 | 9/2016 | Liu et al. |
| 2019/0194383 A1* | 6/2019 | Cheng ............ B32B 15/08 |
| 2021/0060900 A1* | 3/2021 | Huang ............ H05K 1/036 |
| 2022/0132661 A1* | 4/2022 | Liao ............... B32B 27/20 |
| 2022/0181402 A1* | 6/2022 | Huang ............ H10K 59/353 |

* cited by examiner

*Primary Examiner* — Ian A Rummel
(74) *Attorney, Agent, or Firm* — Greer, Burns & Crain, Ltd

(57) ABSTRACT

A prepreg is provided. The prepreg includes a first dielectric layer, which includes a reinforcing material and a first dielectric material, wherein the first dielectric material includes polytetrafluoroethylene, a first filler and a water-soluble thickening agent and a second dielectric layer, which is formed on at least one side of the first dielectric layer and includes a second dielectric material, wherein the second dielectric material does not include a fluoropolymer.

14 Claims, 1 Drawing Sheet

PREPREG AND USES OF THE SAME

CLAIM FOR PRIORITY

This application claims the benefit of Taiwan Patent Application No. 112145577 filed on Nov. 24, 2023, the subject matters of which are incorporated herein in their entirety by reference.

BACKGROUND

Field of the Invention

The present invention provides a prepreg, especially a prepreg with a specific layer composition. The present invention also provides a metal-clad laminate and a printed circuit board prepared using the prepreg.

Descriptions of the Related Art

Portable electronic products are continuously becoming highly functional and must process vast amounts of information at high speeds. Consequently, base station signals have also increased in frequency, and printed circuit boards suitable for high-frequency applications are receiving more attention. To transmit signals without compromising high-frequency signal quality, the industry is focused on reducing the high-frequency transmission loss of printed circuit boards. A printed circuit board is a laminated body formed from an insulating resin substrate and a conductive layer with a wiring pattern. Generally, the transmission loss of a printed circuit board can be divided into two main parts: conductor loss from the conductive layer and dielectric loss from the insulating resin substrate.

To reduce dielectric loss in the insulating resin substrate, thermosetting resins such as epoxy resin or polyphenylene ether resin with low dielectric constants and low dielectric losses are commonly used. However, improvements in the dielectric loss factor (Df) of those thermosetting resins are limited, making it difficult for them to meet the requirements for high-frequency and high-speed electronic materials. Consequently, there is still a need for an insulating resin substrate with a lower Df value.

SUMMARY

In view of the above technical problems, the present invention provides a prepreg comprising a specific layer composition. The specific layer composition comprises a first dielectric layer with specific constituents and a second dielectric layer without fluoropolymers. The prepreg of the present invention exhibits a low Df, good thickness uniformity, a good laminate appearance after hot-pressing, and good impregnation properties. Consequently, the prepreg of the present invention is especially suitable for high-frequency and high speed printed circuit boards.

Therefore, an objective of the present invention is to provide a prepreg, which comprises:
- a first dielectric layer, which comprises a reinforcing material and a first dielectric material, wherein the first dielectric material comprises polytetrafluoroethylene, a first filler and a water-soluble thickening agent; and
- a second dielectric layer, which is formed on at least one side of the first dielectric layer and comprises a second dielectric material, wherein the second dielectric material does not comprise a fluoropolymer.

In some embodiments of the present invention, the first filler is selected from the group consisting of silicon dioxide, alumina, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond powder, diamond-like powder, graphite, calcined kaolin, pryan, mica, hydrotalcite, polytetrafluoroethylene powder, glass bead, ceramic whisker, carbon nanotube, nanosized inorganic powder, strontium titanate, and combinations thereof.

In some embodiments of the present invention, the first filler is a silane-modified filler.

In some embodiments of the present invention, based on the total weight of the first dielectric material, the content of the first filler ranges from 1.5 wt % to 10 wt %.

In some embodiments of the present invention, the water-soluble thickening agent is selected from the group consisting of hydroxyethyl cellulose, nitrocellulose, distarch phosphate, polymethylstyrene, poly(methyl methacrylate), polyethylene glycol, and combinations thereof.

In some embodiments of the present invention, the reinforcing material is selected from the group consisting of an E-glass fabric, a NE-glass fabric, an S-glass fabric, an L-glass fabric, a D-glass fabric, a quartz glass fabric, a Kevlar fabric, a polytetrafluoroethylene fabric, a polyester fabric, a liquid crystal polymer (LCP) fabric, and combinations thereof.

In some embodiments of the present invention, the second dielectric material is formed from a thermosetting resin composition. The thermosetting resin composition can comprise, for example, a thermosetting resin selected from the group consisting of an epoxy resin, a thermosetting phenolic resin, a thermosetting benzoxazine resin, a thermosetting polyphenylene ether resin, and combinations thereof.

In some embodiments of the present invention, the thermosetting resin composition further comprises an additive selected from the group consisting of a catalyst, an elastomer, a second filler, a dispersing agent, a toughener, a viscosity modifying agent, a flame retardant, a coupling agent, and combinations thereof.

Another objective of the present invention is to provide a metal-clad laminate, which is prepared by laminating the aforementioned prepreg and a metal foil.

Yet another objective of the present invention is to provide a printed circuit board, which is prepared from the aforementioned metal-clad laminate.

To render the above objectives, technical features and advantages of the present invention more apparent, the present invention will be described in detail with reference to some embodiments hereinafter.

DETAILED DESCRIPTION

Figure 1:
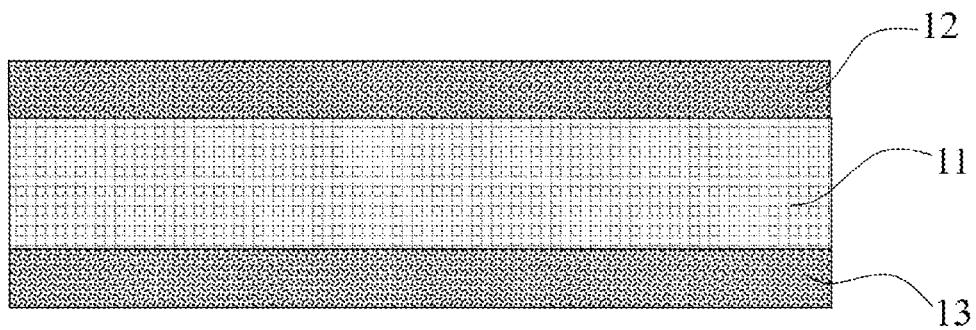
FIG. 1 is a cross-sectional schematic view showing an embodiment of the prepreg of the present invention.

Hereinafter, some embodiments of the present invention will be described in detail. However, the present invention may be embodied in various embodiments and should not be limited to the embodiments described in the specification.

In the appended drawings, similar elements are denoted by similar reference numerals. The thickness of each layer and region may be exaggerated for clarity. Unless it is additionally explained, when a layer is described as being "on" another layer or a substrate, the layer can be directly on the other layer or the substrate, or intervening layer(s) may also be present.

Unless otherwise specified, the expressions "a," "the," or the like recited in the specification and in the claims should include both the singular and the plural forms.

Unless otherwise specified, the terms "first", "second" or similar expressions used in the specification and claims are employed solely for the purpose of distinguishing the depicted elements or components without any specific significance. Those terms are not intended to imply priority.

Unless otherwise specified, while describing the amount of the components in the solution, mixture, composition or varnish in the specification and in the claims, the weight of the solvent is not included.

Unless otherwise specified, all of the thicknesses mentioned in the specification and in the claims are measured by using a thickness measuring micrometer (model: 293-821, available from Mitutoyo).

As used herein, the term "fluoropolymer" refers to a fluorocarbon-based polymer containing fluorine atoms.

The prepreg of the present invention can result in the metal-clad laminate prepared from it having a low Df value, good thickness uniformity, a good appearance, and good impregnation properties by means of combing two dielectric materials with specific constituents, respectively. Further details about the prepreg and its applications are elaborated below.

1. PREPREG

The prepreg of the present invention comprises a first dielectric layer and a second dielectric layer formed on at least one side of the first dielectric layer. In some embodiments of the present invention, the prepreg essentially consists of or consists of the first dielectric layer and the second dielectric layer.

FIG. 1 is a cross-sectional schematic view showing an embodiment of the prepreg of the present invention. The prepreg 1 comprises a first dielectric layer 11 and second dielectric layers 12 and 13 disposed on two sides of the first dielectric layer 11, respectively.

The thickness of the prepreg of the present invention can be 320 µm or less. The thickness of the prepreg of the present invention preferably ranges from 230 µm to 320 µm. For example, the thickness of the prepreg of present invention can be 230 µm, 231 µm, 232 µm, 233 µm, 234 µm, 235 µm, 236 µm, 237 µm, 238 µm, 239 µm, 240 µm, 241 µm, 242 µm, 243 µm, 244 µm, 245 µm, 246 µm, 247 µm, 248 µm, 249 µm, 250 µm, 251 µm, 252 µm, 253 µm, 254 µm, 255 µm, 256 µm, 257 µm, 258 µm, 259 µm, 260 µm, 261 µm, 262 µm, 263 µm, 264 µm, 265µ, 266µ, 267 µm, 268 µm, 269µ, 270µ, 271µ, 272µ, 273 µm, 274 µm, 275 µm, 276 µm, 277 µm, 278 µm, 279 µm, 280 µm, 281 µm, 282 µm, 283 µm, 284 µm, 285 µm, 286 µm, 287 µm, 288 µm, 289 µm, 290 µm, 291 µm, 292 µm, 293 µm, 294 µm, 295 µm, 296 µm, 297 µm, 298 µm, 299 µm, 300 µm, 301 µm, 302 µm, 303 µm, 304 µm, 305 µm, 306 µm, 307 µm, 308 µm, 309 µm, 310 µm, 311 µm, 312 µm, 313 µm, 314 µm, 315 µm, 317 µm, 318 µm, 319 µm, or 320 µm, or within a range between any two of the values described herein.

1.1. First Dielectric Layer

In the prepreg of the present invention, the first dielectric layer comprises a reinforcing material and a first dielectric material. Alternatively, the first dielectric layer essentially consists of or consists of the reinforcing material and the first dielectric material. In some embodiments of the present invention, the first dielectric layer can be manufactured by impregnating a reinforcing material with the first dielectric material or by coating the first dielectric material onto a reinforcing material and then drying the impregnated or coated reinforcing material. The methods for impregnating or coating include, but are not limited to, dipping, roller coating, die coating, bar coating, and spraying. The drying temperature can range from 300° C. to 400° C., and the drying time can range from 1 (one) minute to 30 minutes.

The thickness of the first dielectric layer is not particularly limited. Generally, the thickness of the first dielectric layer can be 60 µm or less. The thickness of the first dielectric layer preferably ranges from 40 µm to 60 µm. For example, the thickness of the first dielectric layer can be 40 µm, 41 µm, 42 µm, 43 µm, 44 µm, 45 µm, 46 µm, 47 µm, 48 µm, 49 µm, 50 µm, 51 µm, 52 µm, 53 µm, 54 µm, 55 µm, 56 µm, 57 µm, 58 µm, 59 µm, or 60 µm, or within a range between any two of the values described herein.

1.1.1. Reinforcing Material

The types of the reinforcing material usable for the prepreg of the present invention are not particularly limited, and any conventional reinforcing material in the art can be used. Generally, the reinforcing material can include fibers selected from the group consisting of glass fibers, inorganic fibers other than glass fibers, organic fibers, and combinations thereof, but the reinforcing material is not limited thereto. Examples of glass fibers include, but are not limited to, E-glass fibers, NE-glass fibers, S-glass fibers, L-glass fibers, D-glass fibers, T-glass fibers, Q-glass fibers, UN-glass fibers, and spherical glass. Examples of inorganic fibers other than glass fibers include, but are not limited to, quartz fibers, paper fibers, and carbon fibers. Examples of organic fibers include, but are not limited to, polyimide, polyamide (e.g., Kevlar), polyester, liquid crystal polymer (e.g., liquid crystal polyester), polytetrafluoroethylene, ultra-high molecular weight polyethylene (UHMWPE), and high-modulus polypropylene (HMPP). The shape of the reinforcing material includes, but is not limited to, woven fabric, non-woven fabric, roving, chopped strand mat, and surfacing mat. For dimensional stability, it is preferable to use fabrics that have undergone super fiber opening treatment and leveling treatment as the reinforcing material. For moisture absorption thermal resistance, it is preferable to use glass fiber woven fabrics that have undergone surface treatments such as epoxy silane treatment, silane coupling agent treatment, and similar treatments as the reinforcing material. In some embodiments of the present invention, the reinforcing material of the first dielectric layer is selected from the group consisting of an E-glass fabric, a NE-glass fabric, an S-glass fabric, an L-glass fabric, a D-glass fabric, a quartz glass fabric, a Kevlar fabric, a polytetrafluoroethylene fabric, a polyester fabric, a liquid crystal polymer (LCP) fabric, and combinations thereof.

1.1.2. First Dielectric Material

In the prepreg of the present invention, the first dielectric material comprises polytetrafluoroethylene, a first filler and a water-soluble thickening agent.

[Polytetrafluoroethylene]

For process convenience, polytetrafluoroethylene in a dispersion state (hereinafter also called "polytetrafluoroethylene dispersion") can be used to prepare the first dielectric material. However, the present invention is not limited thereto; polytetrafluoroethylene in various states, such as a powder state, can also be used. The preparation of the polytetrafluoroethylene dispersion is not a key point of the present invention and thus will not be described in detail. Literature regarding the preparation of the polytetrafluoroethylene dispersion can be found, for example, in U.S. Pat. No. 3,391,099 A, which is referenced herein in its entirety.

Commercially available products of polytetrafluoroethylene dispersion include, but are not limited to: products with the trade name D210 available from Daikin Industries (solid content: 60%), products with the trade name Teflon™ PTFE DISP 30LX available from Chemours (solid content: 60%), products with the trade name Algoflon D 3511F available from Solvay (solid content: 59%), products with the trade name INOFLON® AD9300 available from Gujarat Fluorochemicals Limited (solid content: 60%), and products with the trade name Dyneon™ TF5050Z available from 3M (solid content: 58%). The aforementioned products of polytetrafluoroethylene dispersion can be used alone or in any combination.

Based on the total weight of the first dielectric material, the content of polytetrafluoroethylene can range from 80 wt % to 98 wt %. For example, based on the total weight of the first dielectric material, the content of polytetrafluoroethylene can be 80 wt %, 80.5 wt %, 81 wt %, 81.5 wt %, 82 wt %, 82.5 wt %, 83 wt %, 83.5 wt %, 84 wt %, 84.5 wt %, 85 wt %, 85.5 wt %, 86 wt %, 86.5 wt %, 87 wt %, 87.5 wt %, 88 wt %, 88.5 wt %, 89 wt %, 89.5 wt %, 90 wt %, 90.5 wt %, 91 wt %, 91.5 wt %, 92 wt %, 92.5 wt %, 93 wt %, 93.5 wt %, 94 wt %, 94.5 wt %, 95 wt %, 95.5 wt %, 96 wt %, 96.5 wt %, 97 wt %, 97.5 wt %, or 98 wt %, or within a range between any two of the values described herein.

[First Filler]

The first filler can be any conventional filler that can be used in a metal-clad laminate in the art. Examples of the first filler include, but are not limited to, silicon dioxide (including spherical silicon dioxide, fused silicon dioxide, non-fused silicon dioxide, porous silicon dioxide, hollow silicon dioxide, and nano silicon dioxide), alumina, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond powder, diamond-like powder, graphite, calcined kaolin, pryan, mica, hydrotalcite, polytetrafluoroethylene powder, glass bead, ceramic whisker, carbon nanotube, nanosized inorganic powder, and strontium titanate. The aforementioned fillers can be used alone or in any combination.

The first filler can optionally be subjected to surface treatment(s) in advance to modify the physicochemical properties thereof. Functional groups can be bonded to the surface of the first filler by means of surface treatment(s). Examples of the functional groups include, but are not limited to, alkyl, vinyl, an acrylic group, a methacrylic group, amino, ureido, phenyl, glycidyl, anilino, an isocyanuric group, styryl, and a fluorine atom. In some embodiments of the present invention, the first filler is a silane-modified filler. Consequently, silanes used for surface treatment can have one or more selected from the group consisting of alkyl, vinyl, an acrylic group, a methacrylic group, amino, ureido, phenyl, glycidyl, anilino, an isocyanuric group, styryl, and a fluorine atom. Specifically, particular examples of silanes used for surface treatment include, but are not limited to, vinyltrimethoxysilane, (3-mercaptopropyl) trimethoxysilane, (3-acryloxypropyl) trimethoxysilane, (3-methacryloxypropyl) trimethoxysilane, (3-glycidoxypropyl) trimethoxysilane, (3-glycidoxypropyl) methyldiimethoxysilane, 3-aminopropyltrimethoxysilane, 3-(2-aminoethyl)aminopropyltrimethoxysilane, 3-(2-aminoethyl) propylmethyldimethoxysilane, 3-anilinopropyltrimethoxysilane, 3-anilinopropyltrimethoxysilane, 3-ureidopropyltrimethoxysilane, methyltrimethoxysilane, dimethyldimethoxysilane, trimethylmethoxysilane, methyltriphenoxysilane, n-propyltrimethoxysilane, n-butyltrimethoxysilane, isobutyltrimethoxysilane, n-hexyltrimethoxysilane, cyclohexyltrimethoxysilane, n-octyltrimethoxysilane, n-decyltrimethoxysilane, 1,6-bis (trimethoxysilanyl) hexane, phenyltrimethoxysilane, diphenyldimethoxysilane, parastyryltrimethoxysilane, 2-(3,4-epoxycyclohexyl)ethyltrimethoxysilane, N-phenyl-3-aminopropyltrimethoxysilane, 1,3,5-N-tris (trimethoxysilanylpropyl)triisocyanurate, (heptadecafluoro-1,1,2,2-tetrahydrodecyl)trimethoxysilane, (heptadecafluoro-1,1,2,2-tetrahydrodecyl)triethoxysilane, (tridecafluoro-1,1,2,2-tetrahydrooctyl)trimethoxysilane, (tridecafluoro-1,1,2,2-tetrahydrooctyl)triethoxysilane, (3,3,3-trifluoropropyl) methyldimethoxysilane, (3,3,3-trifluoropropyl) methyldiethoxysilane, (3,3,3-trifluoropropyl) trimethoxysilane, (3,3,3-trifluoropropyl)triethoxysilane, trifluoromethyltrimethylsilane, trimethylsilyl trifluoromethanesulfonate, triethylsilyl trifluoromethanesulfonate, and ter-butyldimethylsilyl trifluoromethanesulfonate. In the appended examples, the first filler is unmodified silicon dioxide or silane-modified silicon dioxide.

Based on the total weight of the first dielectric material, the content of the first filler can range from 1 wt % to 10 wt %. For example, based on the total weight of the first dielectric material, the content of the first filler can be 1 wt %, 1.5 wt %, 2 wt %, 2.5 wt %, 3 wt %, 3.5 wt %, 4 wt %, 4.5 wt %, 5 wt %, 5.5 wt %, 6 wt %, 6.5 wt %, 7 wt %, 7.5 wt %, 8 wt %, 8.5 wt %, 9 wt %, 9.5 wt %, or 10 wt %, or within a range between any two of the values described herein.

[Water-Soluble Thickening Agent]

As used herein, a water-soluble thickening agent refers to a thickening agent with a solubility in water-based solvents greater than 25 mg/L at room temperature. The aforementioned water-based solvents include water and mixtures of alcohols and water (i.e., aqueous alcohol solutions). Examples of alcohols include, but are not limited to, methanol, ethanol, n-propanol, isopropanol, n-butanol, isobutanol, sec-butyl alcohol, tert-butyl alcohol, n-pentyl alcohol, isopentyl alcohol, sec-pentyl alcohol, tert-pentyl alcohol, 1-ethyl-1-propanol, 2-methyl-1-butanol, n-hexyl alcohol, and cyclohexyl alcohol.

The types of water-soluble thickening agents include, but are not limited to, cellulose-based thickening agents, acrylate-based thickening agents, polyurethane-based thickening agents, and inorganic thickening agents. Cellulose-based thickening agents are preferred because they impart better rheological property to the dielectric material and improve its adhesion to the reinforcing material. Examples of cellulose-based thickening agents include, but are not limited to, cellulose, hydroxymethyl cellulose, hydroxyethyl cellulose, hydroxypropyl cellulose, and nitrocellulose. Examples of acrylate-based thickening agents include, but are not limited to, poly(methyl methacrylate). Examples of inorganic thickening agents include, but are not limited to, inorganic salt-based thickening agents and inorganic gel mineral-based thickening agents. Examples of inorganic salt-based thickening agents include, but are not limited to, sodium chloride, potassium chloride, ammonium chloride, sodium sulfate, sodium phosphate, disodium phosphate, and pentasodium triphosphate. Examples of inorganic gel mineral-based thickening agents include, but are not limited to, bentonite, palygorskite and aluminum silicate. The aforementioned thickening agents can be used alone or in combination.

In some embodiments of the present invention, the water-soluble thickening agent is selected from the group consisting of cellulose, hydroxymethyl cellulose, hydroxyethyl cellulose, hydroxypropyl cellulose, nitrocellulose, distarch phosphate, polymethylstyrene, poly(methyl methacrylate), polyethylene glycol, and combinations thereof.

Based on the total weight of the first dielectric material, the content of the water-soluble thickening agent can range from 0.1 wt % to 10 wt %. For example, based on the total weight of the first dielectric material, the content of the water-soluble thickening agent can be 0.1 wt %, 0.5 wt %, 1.5 wt %, 2 wt %, 2.5 wt %, 3 wt %, 3.5 wt %, 4 wt %, 4.5 wt %, 5 wt %, 5.5 wt %, 6 wt %, 6.5 wt %, 7 wt %, 7.5 wt %, 8 wt %, 8.5 wt %, 9 wt %, 9.5 wt %, or 10 wt %, or within a range between any two of the values described herein.

It is known that performing a pre-treatment on the reinforcing material using polytetrafluoroethylene can reduce the Df value. However, polytetrafluoroethylene lacks polarity and thus exhibits poor adhesion properties with the reinforcing material, resulting in poor impregnation of the dielectric layer. This, in turn, leads to undesirable appearance and uneven thickness in the hot-pressed laminate, and may even increase the Df value of the laminate. The inventor of the present invention discovered that by combining polytetrafluoroethylene with the first filler and a water-soluble thickening agent to prepare the dielectric material, and then using the dielectric material together with a second dielectric layer as described below, the aforementioned technical problems can be resolved. This approach results in a prepreg and laminate with several advantages, including a low Df value, good thickness uniformity, good laminate appearance after hot-pressing, and good impregnation properties.

[Optional Constituents]

In addition to polytetrafluoroethylene, the first filler and the water-soluble thickening agent, other additives may be included in the first dielectric material of the prepreg of the present invention, provided that they do not adversely affect its physicochemical and dielectric properties. These optional additives can be included to adaptively improve the physicochemical properties of the manufactured prepreg and metal-clad laminate, or to improve the workability and impregnation properties of the first dielectric material. Examples of such additives include, but are not limited to, dispersing agents, tougheners, viscosity modifying agents, and the like. The selection of these additives can be made by one skilled in the art depending on practical need after reviewing the present disclosure, and it is not considered key features of the present invention. Therefore, a detailed description for these additives is omitted here.

1.2. Second Dielectric Layer

In the prepreg of the present invention, the second dielectric layer is formed on at least one side of the first dielectric layer. In the preferred embodiments of the present invention, the second dielectric layers are formed on both sides of the first dielectric layer, and the thickness of each second dielectric layer can be identical or different. For example, each second dielectric layer formed on the two sides of the first dielectric layer can have identical or different thicknesses and compositions.

The thickness of each second dielectric layer can independently be 130 μm or less. Preferably, the thickness of each second dielectric layer ranges independently from 95 μm to 130 μm. For example, the thickness of each second dielectric layer can independently be 95 μm, 96 μm, 97 μm, 98 μm, 99 μm, 100 μm, 101 μm, 102 μm, 103 μm, 104 μm, 105 μm, 106 μm, 107 μm, 108 μm, 109 μm, 110 μm, 111 μm, 112 μm, 113 μm, 114 μm, 115 μm, 116 μm, 117 μm, 118 μm, 119 μm, 120 μm, 121 μm, 122 μm, 123 μm, 124 μm, 125 μm, 126 μm, 127 μm, 128 μm, 129 μm, or 130 μm, or within a range between any two of the values described herein.

In the prepreg of the present invention, the second dielectric layer comprises a second dielectric material and does not comprise a fluoropolymer. More specifically, the second dielectric layer essentially consists of or consists of the second dielectric material.

1.2.1. Second Dielectric Material

In some embodiments of the present invention, the second dielectric material is formed from a thermosetting resin composition. The thermosetting resin composition comprises a thermosetting resin and optional additive(s).

1.2.1.1. Thermosetting Resin

A thermosetting resin refers to a component which is gradually cured after being heated to form a network structure through a crosslinking reaction. Examples of the thermosetting resin include, but are not limited to, an epoxy resin, a thermosetting phenolic resin, a thermosetting benzoxazine resin, and a thermosetting polyphenylene ether resin. The aforementioned thermosetting resins can either be used alone or in a mixture of two or more. As used herein, reactive functional groups refer to functional groups capable of conducting a curing reaction with other groups. Examples of the reactive functional groups include, but are not limited to, hydroxyl, carboxyl, alkenyl, and amine group. In some embodiments of the present invention, an epoxy resin, a thermosetting polyphenylene ether resin or a combination thereof are used as the thermosetting resin.

[Epoxy Resin]

As used herein, an epoxy resin refers to a thermal-curable resin with at least two epoxy functional groups in each molecule, such as a multi-functional epoxy resin and a linear phenolic epoxy resin. Examples of the multi-functional epoxy resin include, but are not limited to, a bifunctional epoxy resin, a tetrafunctional epoxy resin, and an octafunctional epoxy resin. The selection of epoxy resin types suitable for forming the dielectric material is not particularly limited, and one skilled in the art can choose epoxy resin types as needed after reviewing this disclosure. For example, considering the flame retardancy of the resin composition, a phosphorus-containing epoxy resin or a bromine-containing epoxy resin can be used. When considering halogen-free environmental requirements, a halogen-free epoxy resin can be used.

Examples of the aforementioned epoxy resin include, but are not limited to, a dicyclopentadiene (DCPD-type) epoxy resin, a bisphenol epoxy resin, a phenolic epoxy resin, a diphenylethylene epoxy resin, a triazine skeleton-containing epoxy resin, a fluorene skeleton-containing epoxy resin, a triphenol methane epoxy resin, a biphenyl epoxy resin, a xylylene epoxy resin, a biphenyl aralkyl epoxy resin, a naphthalene epoxy resin, and an alicyclic epoxy resin. Examples of the bisphenol epoxy resin include are not limited to a bisphenol A epoxy resin, a bisphenol F epoxy resin and a bisphenol S epoxy resin. Examples of the phenolic epoxy resin include, but are not limited to, a phenol phenolic epoxy resin, a cresol phenolic epoxy resin, a bisphenol A phenolic epoxy resin or a bisphenol F phenolic epoxy resin. Other examples of the epoxy resin also include a diglycidyl ether of polycyclic aromatics, and examples of polycyclic aromatics include polyfunctional phenols, anthracene, and the like. Examples of the phosphorus-containing epoxy resin include, but are not limited to, a DOPO-modified epoxy resin, wherein DOPO is 9,10-dihydro-9-oxa-10-phosphahenanthrene-10-oxide. Examples of the bromine-containing epoxy resin include but are limited to a tetrabromobisphenol A epoxy resin. The aforementioned epoxy resins can either be used alone or in a mixture of two or more. In the appended examples, a phenolic epoxy resin is used.

In the embodiments where the thermosetting resin composition comprises an epoxy resin, the content of the epoxy resin can be adjusted depending on the need. Generally, based on the total weight of the thermosetting resin composition, the amount of epoxy resin can range from 10 wt % to 50 wt %. For example, based on the total weight of the thermosetting resin composition, the amount of the epoxy resin can be 10 wt %, 15 wt %, 20 wt %, 25 wt %, 30 wt %, 35 wt %, 40 wt %, 45 wt %, or 50 wt %, or within a range between any two of the values described herein.

[Thermosetting Polyphenylene Ether Resin]

As used herein, a thermosetting polyphenylene ether resin refers to a resin with at least a repeating unit

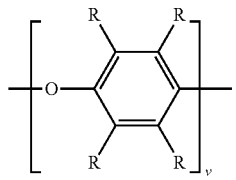

in the main chain and an unsaturated group at the terminal, wherein each R is independently H or a C1-C5 alkyl, and v is an integer ranging from 1 to 100. The unsaturated group refers to a group capable of undergoing addition polymerization with other components containing unsaturated groups. The addition polymerization reaction can be initiated by light or heat in the presence of a polymerization initiator. Examples of the unsaturated group include, but are not limited to, vinyl, vinyl benzyl, allyl, acrylate, and methacrylate. Examples of the thermosetting polyphenylene ether resin include, but are not limited to, a vinyl-containing thermosetting polyphenylene ether resin, an allyl-containing thermosetting polyphenylene ether resin, a vinyl benzyl-containing thermosetting polyphenylene ether resin, an acrylate-containing thermosetting polyphenylene ether resin, and a methacrylate-containing thermosetting polyphenylene ether resin. The aforementioned polyphenylene ether resins can be used alone or in a mixture of two or more.

The method for preparing the thermosetting polyphenylene ether resin is not a key feature of the present invention. Persons having ordinary skill in the art can conduct this method based on the present disclosure and their ordinary skill. Therefore, the detailed method for preparing the thermosetting polyphenylene ether resin is not provided here. Various methods for preparing the thermosetting polyphenylene ether resin can be found in several references, including U.S. Pat. No. 6,995,195 B2 for vinyl benzyl-containing polyphenylene ether resins, U.S. Pat. No. 5,218,030 A for allyl-containing polyphenylene ether resins, U.S. Pat. No. 5,352,745 A for methacrylate-containing polyphenylene ether resins, U.S. Pat. No. 6,352,782 B2 and US 2016/0280913 A1. These references are incorporated herein in their entirety by reference.

In some embodiments of the present invention, the thermosetting resin composition comprises a thermosetting polyphenylene ether resin represented by the following formula (I):

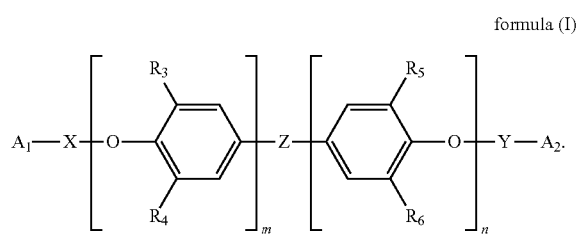

formula (I).

In formula (I), $R_3$, $R_4$, $R_5$ and $R_6$ are independently H, or a substituted or unsubstituted C1-C5 alkyl; m and n are independently an integer ranging from 0 to 100, with the proviso that m and n are not 0 at the same time; Z is absent,

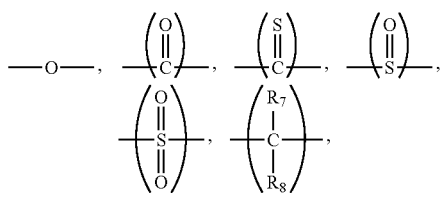

or aryl, wherein $R_7$ and $R_8$ are independently H or a C1-C12 alkyl; X and Y are independently absent, or carbonyl or an alkenyl-containing group; and $A_1$ and $A_2$ are independently

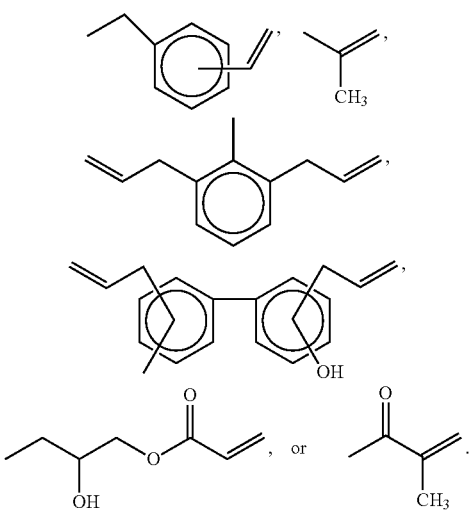

In the preferred embodiments of the present invention, in formula (I), $R_3$, $R_4$, $R_5$ and $R_6$ are —$CH_3$, Z is

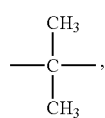

X and Y are absent, and $A_1$ and $A_2$ are independently

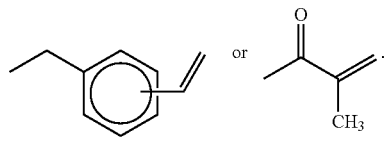

The weight average molecular weight (Mw) of the thermosetting polyphenylene ether resin can range from 1,000 to 50,000, preferably from 1,000 to 10,000, and more preferably from 1,000 to 5,000. Examples of commercially available thermosetting polyphenylene ether resin include products with the trade names OPE-2st 1200 and OPE-2st 2200 available from MITSUBISHI GAS CHEMICAL Company, products with the trade name SA-9000 available from SABIC Company, products with the trade name PP807 available from Chin Yee Chemical Industry Company, and a polyphenylene ether resin available from ASAHI KASEI Company. Using thermosetting polyphenylene ether resin for the dielectric material is preferred for high-frequency applications.

In the embodiments where the thermosetting resin composition comprises a thermosetting polyphenylene ether resin, the content of the thermosetting polyphenylene ether resin can be adjusted depending on the need and is not particularly limited. Generally, based on the total weight of the thermosetting resin composition, the content of the thermosetting polyphenylene ether resin can range from 15 wt % to 60 wt %. For example, based on the total weight of the thermosetting resin composition, the content of the thermosetting polyphenylene ether resin can be 15 wt %, 20 wt %, 25 wt %, 30 wt %, 35 wt %, 40 wt %, 45 wt %, 50 wt %, 55 wt %, or 60 wt %, or within a range between any two of the values described herein.

1.2.1.2. Optional Additives

The thermosetting resin composition can further comprise additive(s). Examples of the additives include, but are not limited to, a catalyst, an elastomer, a filler, a dispersing agent, a toughener, a viscosity modifying agent, a flame retardant, and a coupling agent. The aforementioned additives can be used alone or in a mixture of two or more.

[Hardener]

A hardener refers to a component with unsaturated functional groups that can undergo crosslinking reaction with other components with unsaturated functional groups (e.g., an epoxy resin, or a thermosetting polyphenylene ether resin) to form a stereo network structure. The types of the hardener are not particularly limited as long as it can increase the degree of crosslinking.

In cases where the thermosetting resin composition comprises epoxy resin, suitable hardeners include, but are not limited to, a —OH group-containing compound, an amino-containing compound, an acid anhydride compound, and an active ester compound. The aforementioned hardeners can be used alone or in a mixture of two or more. Specific examples of the hardener include, but are not limited to, phenolic resin (PN resin), styrene maleic anhydride copolymer (SMA copolymer), bismaleimide (BMI), dicyandiamide (Dicy), 4,4'-diaminodiphenyl sulfone (DDS), dianilinomethane, an aromatic diamine, an aromatic dianhydride, an aliphatic dianhydride, a triazine, a cyanate ester resin (CE), a phenolic triazine resin, a benzoxazine resin and a ring-opening polymer thereof, and a copolymer of styrene and vinylphenol. In the appended examples, the hardener is Dicy, BMI or a combination thereof. In cases where the thermosetting resin composition comprises the thermosetting polyphenylene ether resin, the hardener selected from the following group can be used: BMI, a butadiene and/or styrene-containing elastomer, a vinyl and/or allyl-containing isocyanurate, and combinations thereof. The aforementioned hardeners can be used alone or in a mixture of two or more. In the appended examples, the hardener is allyl-containing isocyanurate.

The amount of the hardener can be adjusted depending on the need. In general, based on the total weight of the thermosetting resin composition, the amount of the hardener can range from 15 wt % to 65 wt %. For example, based on the total weight of the thermosetting resin composition, the amount of the hardener can be 15 wt %, 20 wt %, 25 wt %, 30 wt %, 35 wt %, 40 wt %, 45 wt %, 50 wt %, 55 wt %, 60 wt %, or 65 wt %, or within a range between any two of the values described herein.

[Filler]

A filler can improve the mechanical strength, thermal conductivity and dimensional stability of the prepared electronic materials. As used herein, the filler in the second dielectric layer is called "second filler", and the types of the second filler can be identical to or different from those of the first filler. Examples of the second filler are identical to those for the first filler as described above, so they are not described here. In the appended examples, the second filler is silicon dioxide.

Based on the total weight of the thermosetting resin composition, the amount of the second filler can range from 0 wt % to 60 wt %. For example, based on the total weight of the thermosetting resin composition, the amount of the second filler can be 0 wt %, 1 wt %, 5 wt %, 10 wt %, 15 wt %, 20 wt %, 25 wt %, 30 wt %, 35 wt %, 40 wt %, 45 wt %, 50 wt %, 55 wt %, or 60 wt %, or within a range between any two of the values described herein.

[Catalyst]

A catalyst refers to a component that can promote a curing reaction, for example, can promote the ring-opening reaction of epoxy functional groups and lower the curing reaction temperature of the resin composition. The types of the catalyst are not particularly limited as long as it can promote a curing reaction. Suitable catalysts include, but are not limited to, organic peroxides, tertiary amines, quaternary ammonium salts, imidazole compounds, and pyridine compounds. Examples of the organic peroxide include, but are not limited to, benzoyl peroxide (BPO), dicumyl peroxide (DCP) and α,α'-bis(t-butylperoxy)diisopropyl benzene. Examples of the tertiary amine include, but are not limited to, dimethylbenzylamine, 2-(dimethylaminomethyl) phenol, and 2,4,6-tris(dimethylaminomethyl) phenol. Examples of the imidazole compound include, but are not limited to, 2-methylimidazole, 2-ethyl-4-methyl imidazole, and 2-phenylimidazole. Examples of the pyridine compound include, but are not limited to, 2,3-diaminopyridine, 2,5-diaminopyridine, 2,6-diaminopyridine, 4-dimethylaminopyridine, 2-amino-3-methylpyridine, 2-amino-4-methylpyridine, and 2-amino-3-nitropyridine. The aforementioned catalysts can be used alone or in a mixture of two or more.

In cases where the thermosetting resin composition comprises epoxy resin, the catalyst is preferably selected from tertiary amines, quaternary ammonium salts, imidazole compounds, and pyridine compounds. In the appended examples, the catalyst for the epoxy resin is 2-methylimidazole. In cases where the thermosetting resin composition comprises the thermosetting polyphenylene ether resin, the catalyst is preferably selected from organic peroxides. In the appended examples, the catalyst for the thermosetting polyphenylene ether resin is α,α'-bis(t-butylperoxy)diisopropyl benzene.

[Flame Retardant]

A flame retardant can improve the flame retardance of prepared electronic materials. The types of the flame retardant include, but are not limited to, a phosphorus-containing flame retardant, a bromine-containing flame retardant and a nitrogen-containing compound. Each of the flame retardants can be used alone or in a mixture of two or more. Examples of the phosphorus-containing flame retardant include, but are not limited to, phosphate esters, phosphazenes, ammonium polyphosphate, metal phosphinates, and melamine phosphate. The aforementioned phosphorus-containing flame retardants can be used alone or in a mixture of two or more. Examples of the bromine-containing flame retardant include, but are not limited to, tetrabromobisphenol A, decabromodiphenyloxide, decabrominated diphenyl ethane, 1,2-bis(tribromophenyl) ethane, brominated epoxy oligomer, octabromotrimethylphenyl indane, bis(2,3-dibromopropyl ether), tris(tribromophenyl) triazine, brominated aliphatic hydrocarbon, and brominated aromatic hydrocarbon. The aforementioned bromine-containing flame retardants can be used alone or in a mixture of two or more. Examples of the nitrogen-containing compound include, but are not limited to, melamine and derivatives thereof. The commercially available phosphorus-containing flame retardants include products with the trade name Melapur 200 available from BASF Company.

1.3. Preparation of Prepreg

The prepreg of the present invention can be prepared as below.

Initially, the first dielectric material may be prepared into a slurry form, a colloidal group form, or a varnish form for subsequent processing by uniformly mixing the components of the first dielectric material, including polytetrafluoroethylene, the first filler, the water-soluble thickening agent, and optional components, with a stirrer, and dissolving or dispersing the resultant mixture in a solvent. The solvent can be any inert solvent that can dissolve or disperse the components of the first dielectric material but does not react with the components of the first dielectric material. Examples of the solvents that can dissolve or disperse the components of the first dielectric material include, but are not limited to, water, ethanol, isopropanol, and acetone. The aforementioned solvents can be used alone or in a mixture of two or more. The amount of the solvent in the first dielectric material is not particularly limited as long as the components of the first dielectric material can be evenly dissolved or dispersed therein. In the appended examples, water is used.

Next, the second dielectric material is provided by preparing the thermosetting resin composition. Specifically, the thermosetting resin composition may be prepared into a slurry form, a colloidal group form, or a varnish form for subsequent processing by uniformly mixing the components of the thermosetting resin composition, including thermosetting resin and optionally additives, with a stirrer, and dissolving or dispersing the resultant mixture in a solvent. The solvent can be any inert solvent that can dissolve or disperse the components of the thermosetting resin composition but does not react with the components of the thermosetting resin composition. Examples of the solvents that can dissolve or disperse the components of the thermosetting resin composition include, but are not limited to, toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methylpyrolidone (NMP). The aforementioned solvents can be used alone or in a mixture of two or more. The amount of the solvent in the thermosetting resin composition is not particularly limited as long as the components of the thermosetting resin composition can be evenly dissolved or dispersed therein. In the appended examples, methyl ethyl ketone, toluene, or a combination thereof is used.

The first dielectric layer can be formed by impregnating a reinforcing material with the aforementioned first dielectric material (in a slurry form, a colloidal group form, or a varnish form) or by coating the aforementioned first dielectric material onto a reinforcing material, drying the impregnated or coated reinforcing material, and sintering the impregnated or coated reinforcing material under a temperature of not lower than the melting point of polytetrafluoroethylene. The aforementioned impregnating or coating can be repeated several times to achieve the desired thickness of the first dielectric layer, and the conditions for drying the impregnated or coated reinforcing material can be 300° C. to 400° C. for 1 (one) minute to 30 minutes. Next, the prepreg is obtained by forming the second dielectric layer on the two sides of the first dielectric layer. The second dielectric layer is formed by impregnating the first dielectric layer with the aforementioned thermosetting resin composition or coating the aforementioned thermosetting resin composition onto the first dielectric layer and drying the impregnated or coated first dielectric layer. The aforementioned impregnating or coating can be repeated several times to achieve the desired thickness of the second dielectric layer, and the conditions for drying the impregnated or coated first dielectric layer can be 160° C. to 190° C. for 2 to 10 minutes. The methods for impregnating or coating include, but are not limited to, dipping, roller coating, die coating, bar coating, and spraying.

2. METAL-CLAD LAMINATE AND PRINTED CIRCUIT BOARD

The prepreg of the present invention can be laminated with a metal foil to form a metal-clad laminate. Therefore, the present invention also provides a metal-clad laminate prepared by laminating the prepreg of the present invention and a metal foil. Initially, a plurality of the aforementioned prepregs can be superimposed, a metal foil on at least one external surface of the dielectric layer structure composed of the superimposed prepregs to provide a superimposed object, and then a hot-pressing operation is performed to the superimposed object to obtain the metal-clad laminate.

Figure 2:
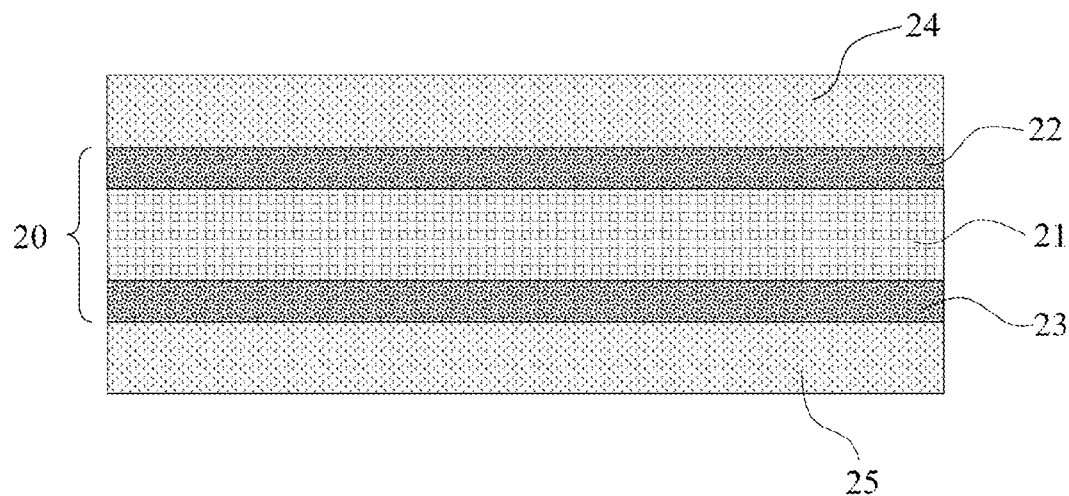
FIG. 2 is a cross-section schematic view showing an embodiment of the metal-clad laminate of the present invention.

FIG. 2 is a cross-section schematic view showing an embodiment of the metal-clad laminate of the present invention. As shown in FIG. 2, the metal-clad laminate 2 comprises a prepreg 20 and conductive layers 24 and 25 disposed on the two sides of the prepreg 20, respectively. The prepreg 20 comprises second dielectric layers 22 and 23 and a first dielectric layer 21 disposed between the second dielectric layers 22 and 23, and the conductive layers 24 and 25 can be any metal foil which can be used in a printed circuit board. Examples of the metal foil include, but are not limited to, a copper foil and an aluminum foil, and a copper foil is preferred.

In addition, the metal-clad laminate of the present invention can be utilized to provide a printed circuit board by further patterning its external metal foil. Therefore, the present invention also provides a printed circuit board, which is manufactured by further patterning the external metal foil of the metal-clad laminate of the present invention. The method for patterning metal foil is not particularly limited and may include techniques such as photolithography, screen printing, and ink-jet printing, among others.

3. EXAMPLES

3.1. Testing Methods

The present invention is further illustrated by the embodiments hereinafter, wherein the testing instruments and methods are as follows.

[Dielectric Loss Factor (Df) Measurement]

The dielectric loss factor (Df) of the metal-clad laminate is measured and calculated according to IPC-TM-650 2.5.5.13 standard under an operating frequency of 10 GHz.

[Thickness Uniformity Test]

Initially, the metal-clad laminate with a length of 24 inch and a width of 18 inch is etched to remove the metal foil, preparing a test sample. Subsequently, five points are marked on both the length and width sides of the test sample. The thickness of the test sample is then measured at these points, resulting in a total of 25 numerical values. The average value of these 25 numerical values is calculated, along with identifying the maximum and minimum values among them. The thickness uniformity is then determined using the following equation.

$$\text{Thickness uniformity} = \frac{(\text{Maximum value} - \text{minimum value})}{\text{Average value}} \times 100\%$$

[Stain Test]

Initially, the metal-clad laminate with a length of 24 inch and a width of 18 inch is etched to remove the metal foil, preparing a test sample. Subsequently, the appearance of the test sample is observed with unaided eyes to detect any black stains or spots. The evaluation criteria are as follows. If no black stains or spots are observed on the appearance of the test sample, the stain test is considered passed, and the result is recorded as "o". If at least one black stain larger than an area of 1 (one) cm×1 (one) cm or at least five black stains smaller than an area of 1 (one) cm×1 (one) cm are observed on the appearance of the test sample, the stain test is considered failed, and the result is recorded as "x"

[Impregnation Property Test]

Initially, the metal-clad laminate with a length of 24 inch and a width of 18 inch is etched to remove the metal foil, preparing a test sample. Subsequently, the appearance of the test sample is observed with unaided eyes to detect any stripes. The evaluation criteria are as follows. If no stripes are observed on the appearance of the test sample, the impregnation property test is considered passed, and the result is recorded as "o". If at least two stripes longer than 0.5 cm or at least five stripes shorter than 0.5 cm are observed on the appearance of the test sample, the impregnation property test is considered failed, and the result is recorded as

3.2. List of Raw Materials Used in Examples and Comparative Examples

TABLE 1

| | List of raw materials |
|---|---|
| Model no. | Description |
| D210 | Polytetrafluoroethylene resin dispersion: solid content: 60%, available from Daikin Industries |
| FMC53001 | Water-soluble thickening agent: cellulose, available from Lotte Fine Chemical |
| ST-180 | Water-soluble thickening agent: distarch phosphate, available from Shun Ching Raw Material |
| TW-710 | Water-soluble thickening agent: aqueous polyurethane, available from An Fong Development |
| AS-M60 | Non-water-soluble thickening agent: polyethylene, available from An Fong Development |
| SA9000 | Polyphenylene ether with unsaturated functional groups, available from SABIC |
| BNE-210 | Epoxy resin, available from Chang Chun Plastics |
| Dicy | Hardener: dicyandiamide, available from Degussa |
| TAIC | Hardener: triallyl isocyanurate, available from Evonik |
| Ricon 100 | Elastomer, available from Cray Valley |
| BMI-70 | Bismaleimide resin, available from K•I Chemical Industry |
| 2MI | Catalyst: 2-methylimidazole, available from Union Chemical |
| Perbutyl-P | Catalyst: α,α'-bis(t-butylperoxy)diisopropyl benzene, available from NOF |
| DQ1040 | $SiO_2$ filler, available from Novoray |
| VF-33 | Phenylsilane-modified SiO2 filler, available from Zhejiang Sanshi New Material Technology |
| NQ6030HF | Fluorine-containing silane-modified SiO2 filler, available from Novoray |
| SC-5500 SVC | $SiO_2$ filler, available from Admatech |

3.3. Preparation of First Dielectric Layer

First dielectric materials 1 to 12 were prepared respectively in accordance with the compositions shown in Table 1, wherein each components were mixed using a stirrer at room temperature, and pure water was added as the solvent. Then the resultant mixture was stirred at room temperature for 60 to 120 minutes to obtain First dielectric materials 1 to 12.

TABLE 2

Composition of first dielectric material

| Unit: added parts by weight | | PTFE D210 | First Filler | | | Water-soluble thickening agent | | | Non-water-soluble thickening agent |
|---|---|---|---|---|---|---|---|---|---|
| | | | DQ 1040 | VF-33 | NQ 6030 HF | FMC 53001 | ST-180 | TE-710 | AS-M60 |
| First dielectric material | 1 | 167 | 3.33 | | | 3.33 | | | |
| | 2 | 167 | 5.33 | | | 3.33 | | | |
| | 3 | 167 | 8.53 | | | 3.33 | | | |
| | 4 | 167 | | 5.33 | | 3.33 | | | |
| | 5 | 167 | | | 5.33 | 3.33 | | | |
| | 6 | 167 | 5.33 | | | | 3.33 | | |
| | 7 | 167 | 8.53 | | | | | 3.33 | |
| | 8 | 167 | 5.33 | | | 0.5 | | | |
| | 9 | 167 | | | | | | | |
| | 10 | 167 | | | | 3.33 | | | |
| | 11 | 167 | 3.33 | | | | | | 3.33 |
| | 12 | 167 | | 8.69 | | | | | |

First dielectric layers 1 to 12 were prepared in the following manners. Initially, glass fiber fabrics (model no.: E1035, thickness: 0.043 mm) were respectively impregnated in First dielectric materials 1 to 12 through roll coaters and the thicknesses of the first dielectric layers were respectively controlled to a proper extent. Then, the impregnated glass fiber fabrics were placed in an oven, heated and baked at 350° C. for 2 to 5 minutes to obtain First dielectric layers 1 to 12.

Furthermore, a non-treated glass fiber fabric (model no.: E1035, thickness: 0.043 mm) was prepared as First dielectric layer 13.

3.4. Preparation of Prepreg 50.0 g of polyphenylene ether SA9000, 50.0 g of TAIC, 10.0 g of elastomer Ricon 100, 1.0 g of catalyst Perbutyl P, and 100.0 g of filler SC-5500 SVC were mixed using a stirrer at room temperature, and then methyl ethyl ketone (available from Methyl Company) and toluene (available from Trans Chief Chemical Industry Company) were added. Subsequently, the resultant mixture was stirred at room temperature for 60 to 120 minutes to obtain Second dielectric material 1.

13.0 g of epoxy resin BNE-210, 25.0 g of Dicy, 15.0 g of BMI-70, 0.01 g of catalyst 2 MI and 30.0 g of filler SC-5500 SVC were mixed using a stirrer at room temperature, and then methyl ethyl ketone was added. Subsequently, the resultant mixture was stirred at room temperature for 60 to 120 minutes to obtain Second dielectric material 2.

According to the compositions shown in Table 3-1 and Table 3-2, prepregs of Examples 1 to 16 and Comparative Examples 1 to 10 were prepared in the following manners. Initially, the first dielectric layers were respectively impregnated with Second dielectric material 1 or Second dielectric material 2, and the thicknesses of the prepregs were carefully controlled. Then, the impregnated first dielectric layers underwent drying in an oven at heated at 175° C. for 2 to 5 minutes to obtain the prepregs of Examples 1 to 16 and Comparative Examples 1 to 10.

TABLE 3-1

Compositions of prepregs of Examples 1 to 16

| | | First dielectric layer | Second dielectric layer |
|---|---|---|---|
| Example | 1 | First dielectric layer 1 | Second dielectric material 1 |
| | 2 | First dielectric layer 2 | |
| | 3 | First dielectric layer 3 | |
| | 4 | First dielectric layer 4 | |
| | 5 | First dielectric layer 5 | |
| | 6 | First dielectric layer 6 | |
| | 7 | First dielectric layer 7 | |
| | 8 | First dielectric layer 8 | |
| | 9 | First dielectric layer 1 | Second dielectric material 2 |
| | 10 | First dielectric layer 2 | |
| | 11 | First dielectric layer 3 | |
| | 12 | First dielectric layer 4 | |
| | 13 | First dielectric layer 5 | |
| | 14 | First dielectric layer 6 | |
| | 15 | First dielectric layer 7 | |
| | 16 | First dielectric layer 8 | |

TABLE 3-2

Compositions of prepregs of Comparative Examples 1 to 10

| | | First dielectric layer | Second dielectric layer |
|---|---|---|---|
| Comparative Example | 1 | First dielectric layer 9 | Second dielectric material 1 |
| | 2 | First dielectric layer 10 | |
| | 3 | First dielectric layer 11 | |
| | 4 | First dielectric layer 12 | |
| | 5 | First dielectric layer 13 | |
| | 6 | First dielectric layer 9 | Second dielectric material 2 |
| | 7 | First dielectric layer 10 | |
| | 8 | First dielectric layer 11 | |
| | 9 | First dielectric layer 12 | |
| | 10 | First dielectric layer 13 | |

3.5. Preparation of Metal-Clad Laminate

Metal-clad laminates of Examples 1 to 16 and Comparative Examples 1 to 10 were prepared respectively by using the prepregs of Examples 1 to 16 and Comparative Examples 1 to 10. Initially, several pieces of the prepreg were superimposed, and two sheets of copper foils (each 0.5 oz) were superimposed on the respective two surfaces of the outermost layers, and then the prepared objects were placed in a hot press machine to be cured through a high temperature hot-pressing to obtain the metal-clad laminates of Examples 1 to 16 and Comparative Examples 1 to 10. The hot-pressing conditions were as follows: heating to 200° C. to 220° C. at a heating rate of 2° C./min to 4° C./min, and hot-pressing at 200° C. to 220° C. for 2 hours under a full pressure of 15 kg/cm$^2$ (with an initial pressure of 8 kg/cm$^2$).

The properties of the metal-clad laminates of Examples 1 to 16 and Comparative Examples 1 to 10, including Df value, stain situation, thickness uniformity, and impregnation properties, were tested according to the aforementioned testing methods, and the results are tabulated in Table 4-1 and Table 4-2.

TABLE 4-1

Properties of metal-clad laminates of Examples 1 to 16

| | | Df | Thickness uniformity (%) | Stain | Impregnation property |
|---|---|---|---|---|---|
| Example | 1 | 0.00286615 | 2.941176 | ○ | ○ |
| | 2 | 0.00293710 | 2.539062 | ○ | ○ |
| | 3 | 0.00307990 | 2.330097 | ○ | ○ |
| | 4 | 0.00211850 | 2.400000 | ○ | ○ |
| | 5 | 0.00215650 | 2.970197 | ○ | ○ |
| | 6 | 0.00293654 | 2.534113 | ○ | ○ |
| | 7 | 0.00304950 | 2.755905 | ○ | ○ |
| | 8 | 0.00304950 | 2.988047 | ○ | ○ |
| | 9 | 0.00979640 | 2.008032 | ○ | ○ |
| | 10 | 0.00996740 | 2.395209 | ○ | ○ |
| | 11 | 0.01025240 | 2.982107 | ○ | ○ |
| | 12 | 0.00720195 | 2.574157 | ○ | ○ |
| | 13 | 0.00724850 | 2.941176 | ○ | ○ |
| | 14 | 0.00992750 | 2.755905 | ○ | ○ |
| | 15 | 0.00997500 | 2.380952 | ○ | ○ |
| | 16 | 0.00998260 | 3.000000 | ○ | ○ |

TABLE 4-2

Properties of metal-clad laminates of Comparative Examples 1 to 10

| | | Df | Thickness uniformity (%) | Stain | Impregnation property |
|---|---|---|---|---|---|
| Comparative Example | 1 | 0.003289 | 15.384620 | ○ | x |
| | 2 | 0.003159 | 16.981130 | ○ | x |
| | 3 | 0.003817 | 23.529410 | x | ○ |
| | 4 | 0.003280 | 25.844930 | ○ | x |
| | 5 | 0.003252 | 4.081633 | ○ | ○ |
| | 6 | 0.011130 | 15.094340 | ○ | x |
| | 7 | 0.010907 | 16.981130 | ○ | x |
| | 8 | 0.012811 | 25.490200 | x | ○ |
| | 9 | 0.010850 | 25.742570 | x | ○ |
| | 10 | 0.010823 | 4.000000 | ○ | ○ |

As shown in Table 4-1, the metal-clad laminates manufactured from the prepreg of the present invention each exhibit a low Df value and good thickness uniformity, and they pass stain test and impregnation property test. Specifically, when the first dielectric material simultaneously comprises PTFE, the first filler and the water-soluble thickening agent in a specific ratio, even with different second dielectric materials, the manufactured metal-clad laminate achieves a low Df value and good thickness uniformity, and passes stain test and impregnation property test. Additionally, Examples 4, 5, 12 and 13 demonstrate that, when the first filler is a silane-modified filler, the Df of the manufactured metal-clad laminate can be further improved.

By contrast, as shown in Table 4-2, the metal-clad laminates manufactured from the prepreg not falling within the scope of the present invention cannot simultaneously exhibit a low Df value and good thickness uniformity, nor do they pass stain test and impregnation property test. Specifically, Comparative Examples 1 to 4 and 6 to 9 show that, without the first dielectric material simultaneously comprising PTFE, the first filler and the water-soluble thickening agent, the manufactured metal-clad laminate cannot simultaneously have a low Df value and good thickness uniformity, and cannot pass stain test and impregnation property test. Additionally, the comparison between Comparative Example 5 and Examples 1 to 8, or between Comparative Example 10 and Examples 9 to 16, illustrates that prepreg prepared without using the first dielectric material, the metal-clad laminate may pass the stain test and impregnation property test, but has a higher Df value and obviously poor thickness uniformity. This demonstrates that using a specific first dielectric material can lower Df and improve thickness uniformity.

The above examples are used to illustrate the principle and efficacy of the present invention and show the inventive features thereof, but are not used to limit the scope of the present invention. People skilled in this field may proceed with a variety of modifications and replacements based on the disclosures and suggestions of the invention as described. Therefore, the scope of protection of the present invention is that as defined in the claims as appended.

BRIEF DESCRIPTION OF NUMERAL REFERENCES

1, 20: prepreg
2: metal-clad laminate
11, 21: first dielectric layer
12, 13, 22, 23: second dielectric layer
24, 25: conductive layer

What is claimed is:

1. A prepreg, which comprises:
a first dielectric layer, which comprises a reinforcing material and a first dielectric material, wherein the first dielectric material comprises polytetrafluoroethylene, a first filler and a water-soluble thickening agent; and
second dielectric layers, formed respectively on both sides of the first dielectric layer and each comprise a second dielectric material, wherein the second dielectric material does not comprise a fluoropolymer,
wherein based on the total weight of the first dielectric material, the content of the first filler ranges from 1.5 wt % to 10.0 wt %.

2. The prepreg of claim 1, wherein the first filler is selected from the group consisting of silicon dioxide, alumina, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond powder, diamond-like powder, graphite, calcined kaolin, pryan, mica, hydrotalcite, polytetrafluoroethylene powder, glass bead, ceramic whisker, carbon nanotube, nanosized inorganic powder, strontium titanate, and combinations thereof.

3. The prepreg of claim 1, wherein the first filler is a silane-modified filler.

4. The prepreg of claim 1, wherein the water-soluble thickening agent is selected from the group consisting of hydroxyethyl cellulose, nitrocellulose, distarch phosphate, polymethylstyrene, poly(methyl methacrylate), polyethylene glycol, and combinations thereof.

5. The prepreg of claim 2, wherein the water-soluble thickening agent is selected from the group consisting of hydroxyethyl cellulose, nitrocellulose, distarch phosphate, polymethylstyrene, poly(methyl methacrylate), polyethylene glycol, and combinations thereof.

6. The prepreg of claim 3, wherein the water-soluble thickening agent is selected from the group consisting of hydroxyethyl cellulose, nitrocellulose, distarch phosphate, polymethylstyrene, poly(methyl methacrylate), polyethylene glycol, and combinations thereof.

7. The prepreg of claim 1, wherein the reinforcing material is selected from the group consisting of an E-glass fabric, a NE-glass fabric, an S-glass fabric, an L-glass fabric, a D-glass fabric, a quartz glass fabric, a Kevlar fabric, a polytetrafluoroethylene fabric, a polyester fabric, a liquid crystal polymer (LCP) fabric, and combinations thereof.

8. The prepreg of claim 2, wherein the reinforcing material is selected from the group consisting of an E-glass fabric, a NE-glass fabric, a S-glass fabric, a L-glass fabric, a D-glass fabric, a quartz glass fabric, a Kevlar fabric, a polytetrafluoroethylene fabric, a polyester fabric, a liquid crystal polymer (LCP) fabric, and combinations thereof.

9. The prepreg of claim 3, wherein the reinforcing material is selected from the group consisting of an E-glass fabric, a NE-glass fabric, a S-glass fabric, a L-glass fabric, a D-glass fabric, a quartz glass fabric, a Kevlar fabric, a polytetrafluoroethylene fabric, a polyester fabric, a liquid crystal polymer (LCP) fabric, and combinations thereof.

10. The prepreg of claim 1, wherein the second dielectric material is formed from a thermosetting resin composition.

11. The prepreg of claim 10, wherein the thermosetting resin composition comprises a thermosetting resin selected from the group consisting of an epoxy resin, a thermosetting phenolic resin, a thermosetting benzoxazine resin, a thermosetting polyphenylene ether resin, and combinations thereof.

12. The prepreg of claim 10, wherein the thermosetting resin composition further comprises an additive selected from the group consisting of a catalyst, an elastomer, a second filler, a dispersing agent, a toughener, a viscosity modifying agent, a flame retardant, a coupling agent, and combinations thereof.

13. A metal-clad laminate, which is prepared by laminating the prepreg of claim 1 and a metal foil.

14. A printed circuit board, which is prepared from the metal-clad laminate of claim 13.

* * * * *